United States Patent
Becker

(10) Patent No.: US 6,833,624 B2
(45) Date of Patent: Dec. 21, 2004

(54) SYSTEM AND METHOD FOR ROW DECODE IN A MULTIPORT MEMORY

(75) Inventor: Scott T. Becker, Darien, IL (US)

(73) Assignee: Artisan Components, Inc., Sunnyvale, CA (US)

( * ) Notice: Subject to any disclaimer, the term of this patent is extended or adjusted under 35 U.S.C. 154(b) by 14 days.

(21) Appl. No.: 10/364,198

(22) Filed: Feb. 10, 2003

(65) Prior Publication Data

US 2004/0155343 A1 Aug. 12, 2004

(51) Int. Cl.$^7$ .............................................. H01L 23/48

(52) U.S. Cl. .................... 257/758; 257/758; 257/756

(58) Field of Search ................................. 257/758, 686; 365/189.02, 189.04, 233, 230.05, 230.01, 230.06

(56) References Cited

U.S. PATENT DOCUMENTS 5,612,923 A * 3/1997 Gibson et al. ......... 365/230.05

* cited by examiner

Primary Examiner—David Nelms
Assistant Examiner—Thinh T Nguyen
(74) Attorney, Agent, or Firm—Martine & Penilla, LLP

(57) ABSTRACT

The invention provides overlapping row decode in a multiport memory. Overlapping row decode includes predecode wires positioned on a first metallization layer and configured to address wordline drivers of a first port. A second plurality of predecode wires is located on a third metallization layer and configured to address wordline drivers of a second port. The overlapping row decode includes a plurality of wordline connections that are formed on a second metallization layer between the first metallization layer and the third metallization layer. The wordline connections include a first and second portion. The first portion communicates with the first plurality of predecode wires and the wordline drivers of the first port. The second portion communicates with the second plurality of predecode wires and the wordline drivers of the second port.

20 Claims, 7 Drawing Sheets

SYSTEM AND METHOD FOR ROW DECODE IN A MULTIPORT MEMORY

BACKGROUND OF THE INVENTION

1. Field of the Invention

This invention relates generally to computer memories, and more particularly to a row decode having overlapping predecode wires in a multiport memory.

2. Description of the Related Art

Currently, random access memory (RAM) architectures include an array of memory cells, arranged as rows and columns, with each cell storing one bit of information. As is well known, the rows are accessed using wordlines and the columns are accessed via bitlines. Generally, storage capacity and operational speed of the memory are important attributes for systems requiring memory devices. Storage capacity refers to the amount of data that a memory device can store, and operational speed refers to the speed at which the memory device can store or retrieve data.

System access speed can often be dramatically increased through the use of mutliport memory architectures having two or more access ports. For example, a dual port memory has two access ports, allowing more than one system device to directly access the memory. In contrast, a single port memory permits direct coupling to only one system device, and as a result, other system devices must contend for the port to gain access to the memory. By permitting direct coupling to more than one system device, overall system performance is usually enhanced.

FIG. 1 is a block diagram showing a conventional multiport memory 100. The multiport memory 100 includes a multiport core array 102 coupled to a write port 104 for data input, and a read port 106 having sense amplifiers and output circuitry for data output. Also included are read wordline drivers 108 coupled to read control circuitry 114, and write wordline drivers 110 coupled write control circuitry 112. To address the read wordline drivers 108, a read row decode 116 coupled to predecode circuitry 118 is included. Similarly, to address the write wordline drivers 110, a write row decode 120 coupled to predecode circuitry 122 is included.

As shown in FIG. 1, the read row decode 116 and the write row decode 120 each including a plurality of predecode wires that are utilized to address the read wordline drivers 108 and the write wordline drivers 110. More specifically, each predecode wire of the row decode units 116 and 120 is connected to a particular row of the wordline drivers 108 or 110. In addition, several predecode wires can be coupled to an AND gate. to facilitate addressing. Unfortunately, to ensure the predecode wires are separately addressable, conventional multiport memories 100 include a large amount of whitespace surrounding the predecode wires of the row decode units 116 and 120.

In view of the foregoing, there is a need for port predecode circuitry with reduced area requirements. Specifically, the port predecode circuitry should allow proper addressing of port wordline drivers, while requiring less area for the predecode wires of the port predecode circuity.

SUMMARY OF THE INVENTION

Broadly speaking, the present invention fills these needs by providing an overlapping row decode that reduces the area required for wordline row decode in multiport memories. In one embodiment, a method for making a row decode in a multiport memory is disclosed. A first plurality of predecode wires is formed on a first metalization layer. The first plurality of predecode wires is configured to address wordline drivers of a first port. A plurality of wordline connections is formed on a second metalization layer above the first metalization layer, where the wordline connections are portioned into two portions. A first portion of the plurality of the wordline connections is in communication with both the wordline drivers of the first port and the first plurality of predecode wires. A second plurality of predecode wires is formed on a third metalization layer above the second metalization layer. The second plurality of predecode wires is configured to address wordline drivers of a second port. The second plurality of predecode wires is in communication with the second portion of wordline connections, which are further in communication with the wordline drivers of the second port. Optionally, the second plurality of predecode wires can overlap the first plurality of predecode wires. Also optionally, the first metalization layer can be an m1 layer, the second metalization layer can be an m2 layer, and the third metalization layer can be an m3 layer.

In an additional embodiment, a multiport memory is disclosed. The multiport memory includes a first plurality of predecode wires positioned on a first metalization layer. The first plurality of predecode wires is configured to address wordline drivers of a first port. In addition, a second plurality of predecode wires is located on a third metalization layer above the first metalization layer. The second plurality of predecode wires is configured to address wordline drivers of a second port. The multiport memory further includes a plurality of wordline connections that are formed on a second metalization layer between the first metalization layer and the third metalization layer. As above, the plurality of wordline connections includes a first portion and a second portion. The first portion of the plurality of wordline connections is in communication with the first plurality of predecode wires and the wordline drivers of the first port. The second portion of the plurality of wordline connections is in communication with the second plurality of predecode wires and the wordline drivers of the second port. As above, the second plurality of predecode wires can overlap the first plurality of predecode wires. In one aspect, the second plurality of predecode wires can be skewed from the first plurality of predecode wires. Typically, the first plurality of predecode wires, the second plurality of predecode wires, and the plurality of wordline connections can form a first overlapping row decode unit. In this case, the multiport memory can include a second overlapping row decode unit that is used in conjunction with the first overlapping row decode unit to address the first port and second port.

A generator for generating a row decode in a multiport memory is disclosed in a further embodiment of the present invention. The generator includes logic that generates, on a first metalization layer, a first plurality of predecode wires that is configured to address wordline drivers of a first port. In addition, logic is included that generates a plurality of wordline connections on a second metalization layer above the first metalization layer. A first portion of the plurality of the wordline connections is in communication with the wordline drivers of the first port and the first plurality of predecode wires. The generator further includes logic that generates a second plurality of predecode wires on a third metalization layer above the second metalization layer. The second plurality of predecode wires is configured to address wordline drivers of a second port. In addition, the second plurality of predecode wires is in communication with a second portion of the plurality of wordline connections, which are further in communication with the wordline drivers of the second port. As above, the second plurality of predecode wires can overlap the first plurality of predecode wires. In addition, the generator can include logic that interleaves the predecode wires. In this aspect, the generator includes logic that generates a fourth plurality of predecode wires, on the third metalization layer, which is configured to address wordline drivers of the first port. In addition, logic can be included that generates a fifth plurality of predecode wires on the first metalization layer. The fifth plurality of predecode wires is configured to address wordline drivers of the second port. Further, logic can be included that connects the first portion of the plurality of the wordline connections to the fourth plurality of predecode wires, and logic that connects the second portion of the plurality of the wordline connections to the fifth plurality of predecode wires.

Thus, embodiments of the present invention allow "stacking" of the predecode wires for different ports. As a result of stacking the port predecode wires, the area required for port predecode in embodiments of the present invention advantageously is reduced to about half of the area required for port predecode in conventional multiport memories. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an overlapping row decode that reduces row decode area requirements in multiport memories. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
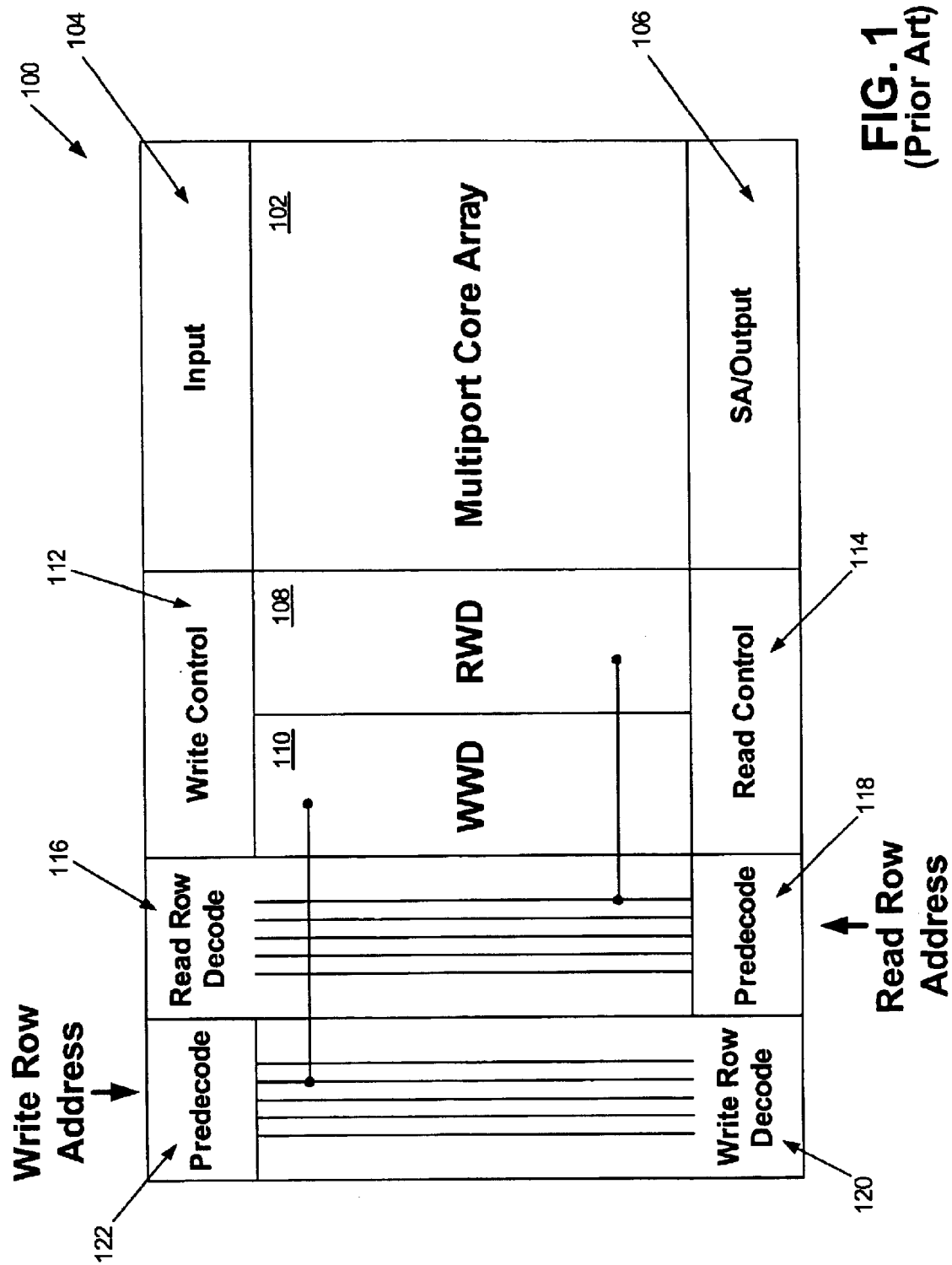
FIG. 1 is a block diagram showing a conventional multiport memory.
Figure 2:
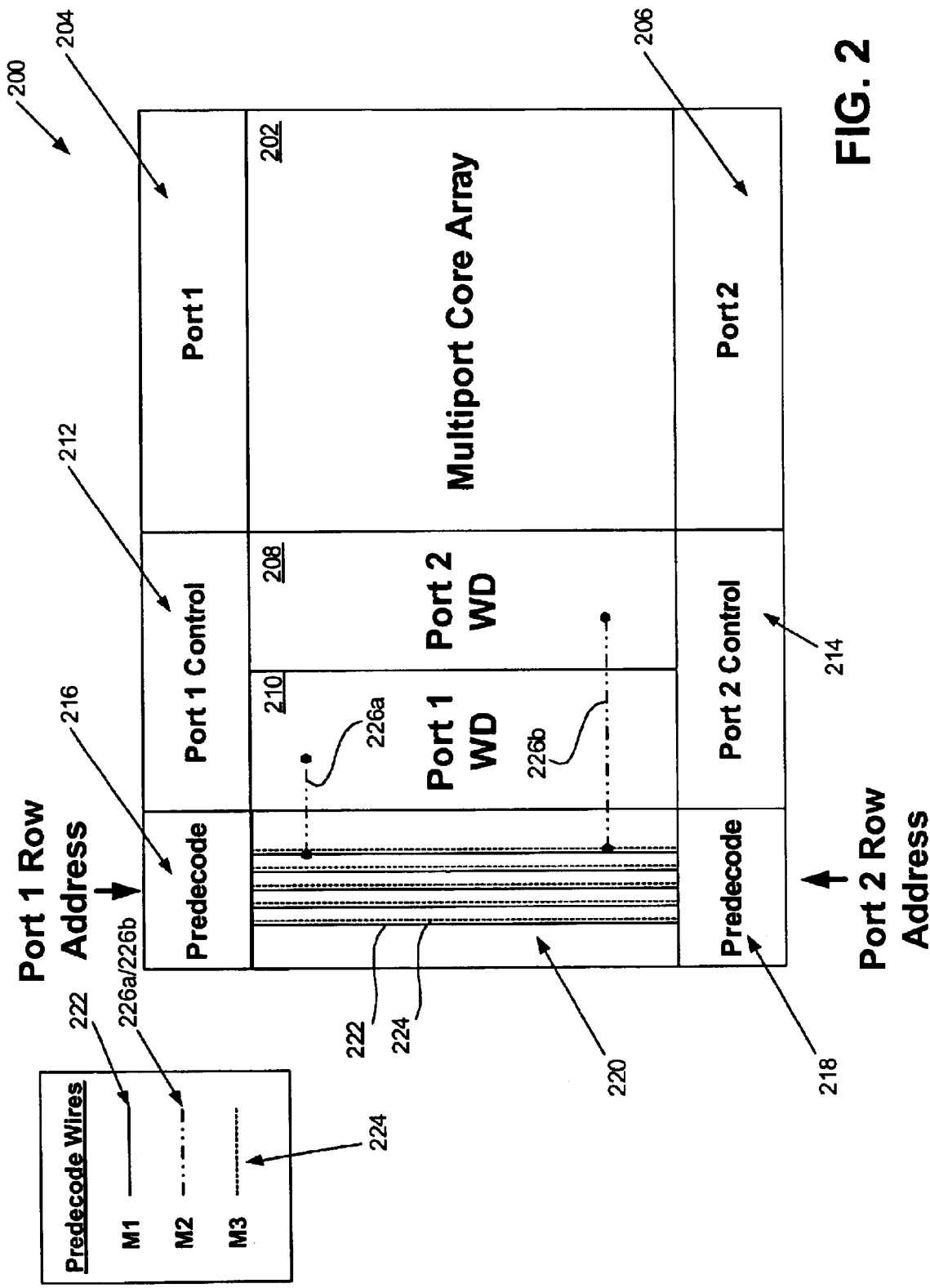
FIG. 2 is a block diagram showing a multiport memory having an overlapping row decode, in accordance with an embodiment of the present invention.

FIG. 2 is a block diagram showing a multiport memory 200 having an overlapping row decode, in accordance with an embodiment of the present invention. The multiport memory 200 includes a multiport core array 202 coupled to a first port 204 and a second port 206. The first and second ports 204 and 206 can be configured as desired by the user. For example, port 1 204 can be configured as a write port for data input, and port 2 206 can be configured as a read port having sense amplifiers and output circuitry for data output. Although, embodiments of the present invention will be describe in terms of a dual-port memory, it should be noted that embodiments of the present invention can be utilized with any size multiport memory.

Also shown in FIG. 2 are port 1 wordline drivers 210 coupled port 1 control circuitry 212, and port 2 wordline drivers 208 coupled to port 2 control circuitry 214. To address the port 1 wordline drivers 210 and the port 2 wordline drivers 208, an overlapping row decode 220 is included that is coupled to port 1 predecode circuitry 216 and port 2 predecode circuitry 218.

The overlapping row decode 220 includes a plurality of port 1 predecode wires 222 and a plurality of port 2 predecode wires 224 that are utilized to address the port 1 wordline drivers 210 and the port 2 wordline drivers 208. However, to conserve area, embodiments of the present invention overlap the port 1 and port 2 predecode wires 222 and 224. That is, the port 1 predecode wires 222 occupy a different metal layer than the port 2 predecode wires 224. In this manner, the port 1 and port 2 predecode wires 222 and 224 can "stack" above one another, which conserves area in the multiport memory 200. As mentioned above, embodiments of the present invention can be utilized with any size multiport memory. For example, when additional ports are present, all predecode wires for all ports can be "stacked" within the overlapping row decode 220.

In one embodiment, the port 1 and port 2 predecode wires 222 and 224 are configured such that at least one metal layer is disposed between the metal layers occupied by the port 1 predecode wires 222 and the port 2 predecode wires 224. As a result, port 1 and port 2 wordline driver connections 226a and 226b can be positioned on a metal layer between the metal layers occupied by the port 1 and port 2 predecode wires 222 and 224. Contacts are used to couple the port 1 and port 2 wordline driver connections 226a and 226b to the port 1 and port 2 predecode wires 222 and 224. Since the contacts are located at different places, the same metal layer can be used for both the port 1 and port 2 wordline driver connections 226a and 226b.

For example, in FIG. 2, the port 1 predecode wires are located on metal layer m1, and the port 2 predecode wires are located on metal layer m3. Disposed between metal layers m1 and m3 occupied by the port 1 and port 2 predecode wires 222 and 224, are the port 1 and port 2 wordline driver connections 226a and 226b, located on metal layer m2. It should be noted that FIG. 2 shows the port 1 and port 2 predecode wires 222 and 224 located horizontally adjacent to one another for purposes of illustration. Generally, the port 1 and port 2 predecode wires 222 and 224 are located directly above one another, that is, on different metal layers. However, it should be noted that the port 1 and port 2 predecode wires can be skewed from each other. In this manner, the m2 metal layer insulates the port 1 predecode wires 222 from the port 2 predecode wires 224, allowing them to be "stacked" on top of one another. As a result of stacking the port 1 and port 2 predecode wires 222 and 224, the area required for port predecode in embodiments of the present invention advantageously is reduced to about half of the area required for port predecode in conventional multiport memories.

Figure 3A:
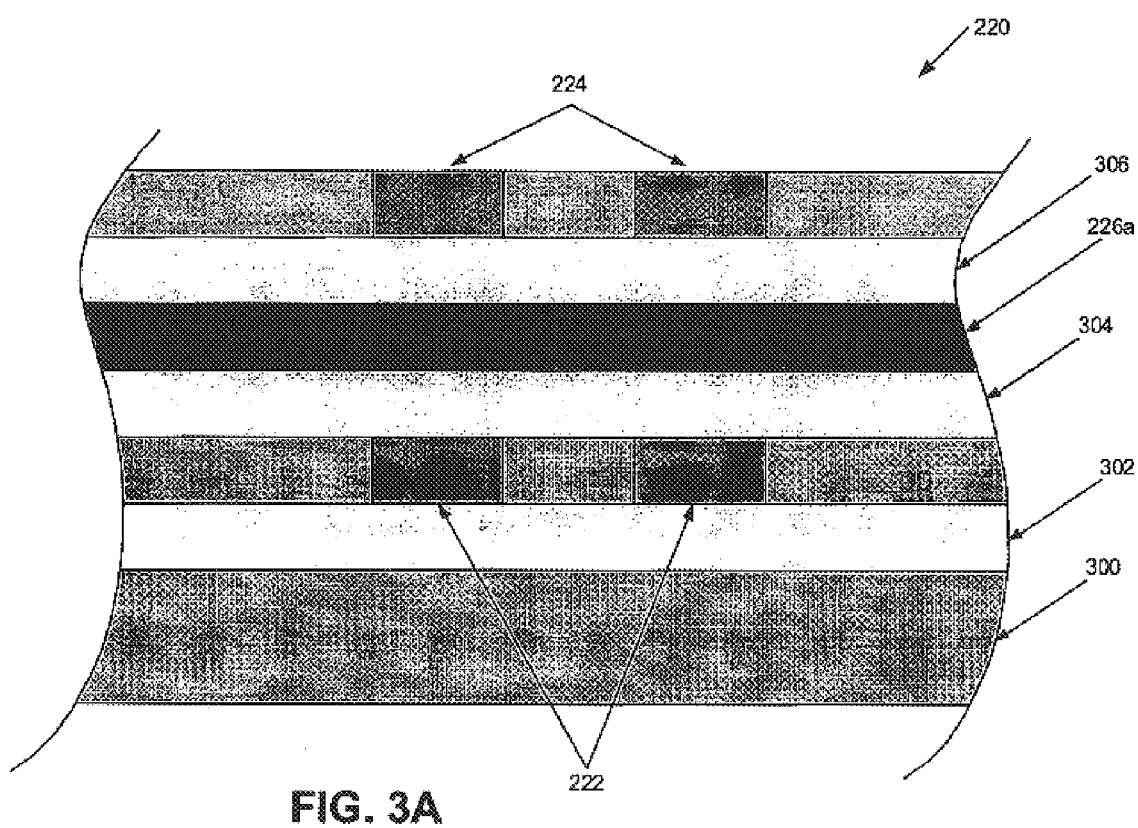
FIG. 3A is a diagram showing a cross sectional view of an overlapping row decode, in accordance with an embodiment of the present invention.

FIG. 3A is a diagram showing a cross sectional view of an overlapping row decode 220, in accordance with an embodiment of the present invention. As shown in FIG. 3A, the overlapping row decode 220 includes port 1 predecode wires 222 disposed above a first insulation layer 302, which is formed above a semiconductor substrate layer 300. A second insulation layer 304 is formed above the port 1 predecode wires 222 followed by a port 1 wordline connection 226a, which is disposed above the second insulation layer 304. A third insulation layer 306 is formed above the port 1 wordline connection 226a, and the port 2 predecode wires 224 are formed above the third insulation layer 306. Although a port 1 wordline connection 226a is shown in FIG. 3A, it should be noted that port 2 wordline connections 226b can also be located on the same metal layer as the port 1 wordline connections 226a.

In use, each predecode wire 222/224 of the overlapping row decode units 220 is connected to a particular row of the wordline drivers. In addition, several predecode wires can be coupled to an AND gate to facilitate addressing. As mentioned above, the stacking of the port 1 and port 2 predecode wires 222 and 224 reduces the area required for port predecode in embodiments of the present invention to about half of the area required for port predecode in conventional multiport memories. Although FIG. 3A shows all the predecode wires of a particular port occupying a single metal layer, it should be noted that the predecode wires can be interleaved, so long as predecode wires for different ports stack on top of each other.

Figure 3B:
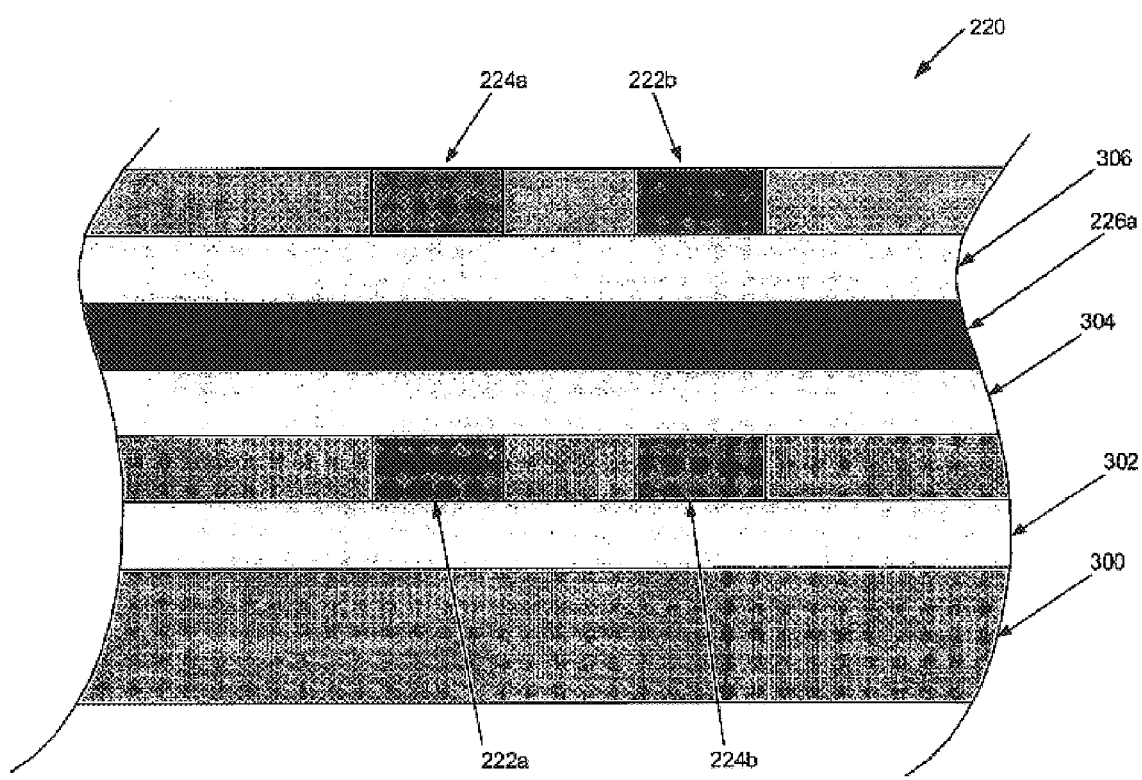
FIG. 3B is a diagram showing a cross sectional view of an overlapping row decode having interleaved predecode wires, in accordance with an embodiment of the present invention.

FIG. 3B is a diagram showing a cross sectional view of an overlapping row decode 220 having interleaved predecode wires, in accordance with an embodiment of the present invention. As shown in FIG. 3B, the overlapping row decode 220 includes a port 1 predecode wire 222a and a port 2 predecode wire 224b disposed above a first insulation layer 302, which is formed above a semiconductor substrate layer 300. A second insulation layer 304 is formed above the port 1 and port 2 predecode wires 222a and 224a followed by a port 1 wordline connection 226a, which is disposed above the second insulation layer 304. A third insulation layer 306 is formed above the port 1 wordline connection 226a, and a port 2 predecode wire 224a and port 1 predecode wire 222b are formed above the third insulation layer 306. As above, although a port 1 wordline connection 226a is shown in FIG. 3B, it should be noted that port 2 wordline connections 226b can also be located on the same metal layer as the port 1 wordline connections 226a.

The predecode wires of FIG. 3B are interleaved such that the predecode wires for different ports stack on top of each other. For example, port 2 predecode wire 224a is stacked above port 1 predecode wire 222a, and port 1 predecode wire 222b is stacked above port 2 predecode wire 224b. As mentioned above, the stacking of the predecode wires for different ports reduces the area required for port predecode in embodiments of the present invention to about half of the area required for port predecode in conventional multiport memories.

Figure 4:
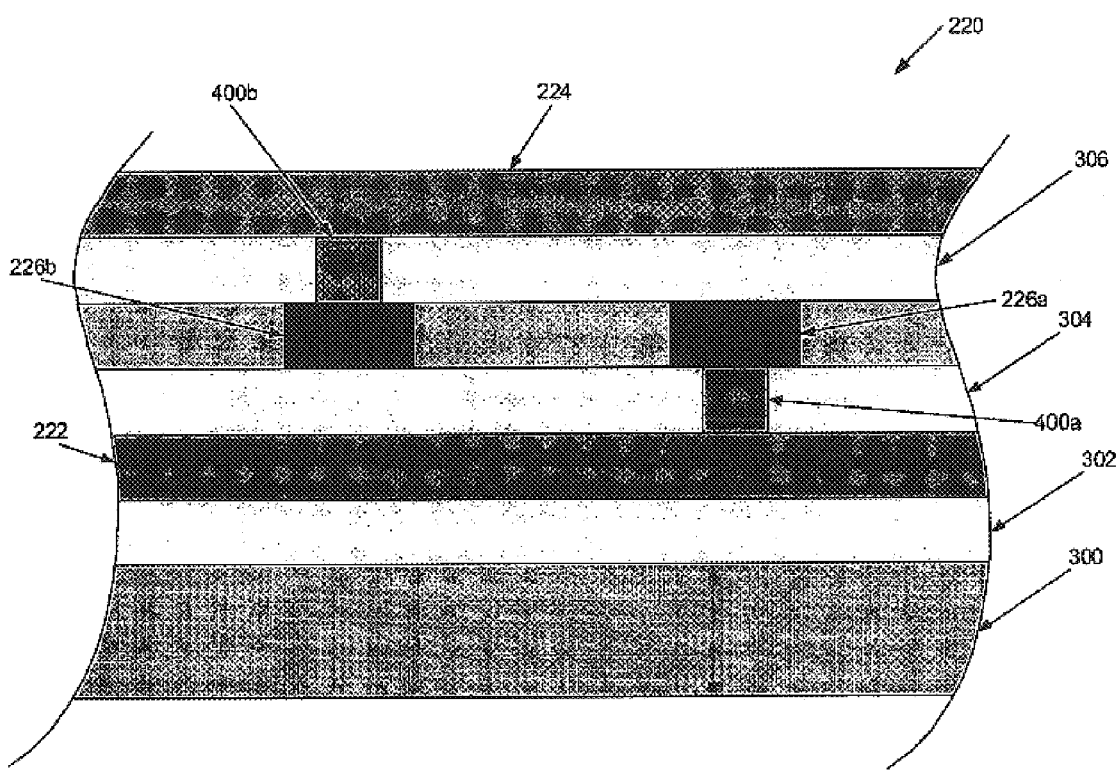
FIG. 4 is a diagram showing a further cross sectional view of an overlapping row decode perpendicular to the FIG. 3 cross sectional view, in accordance with an embodiment of the present invention.

FIG. 4 is a diagram showing a further cross sectional view of an overlapping row decode 220 perpendicular to the FIG. 3 cross sectional view, in accordance with an embodiment of the present invention. Similar to FIG. 3, the overlapping row decode 220 of FIG. 4 includes a port 1 predecode wire 222 disposed above the first insulation layer 302, which is formed above the semiconductor substrate layer 300. A second insulation layer 304 is formed above the port 1 predecode wire 222 followed by port 1 and port 2 wordline connections 226a and 226b, which are disposed above the second insulation layer 304. A third insulation layer 306 is formed above the port 1 and port 2 wordline connections 226a and 226b, and the port 2 predecode wire 224 is formed above the third insulation layer 306. Although a single port 1 predecode wire 222 and a single port 2 predecode wire 224 are shown in FIG. 4, it should be noted that multiple port 1 and port 2 predecode wires 222 and 224 generally are formed at the respective metal layers.

To configure addressing for the multiport memory, specific predecode wires are coupled to selected worline driver connections using contacts 400a and 400b. For example, in FIG. 4, the port 1 predecode wire 222 is coupled to the port 1 wordline connection 226a using contact 400a. Similarly, the port 2 predecode wire 224 is coupled to the port 2 wordline connection 226b using contact 400b. By using contacts that occupy separate insulation layers, embodiments of the present invention advantageously enhance flexibility for address line placement. Embodiments of the present invention can also be utilized with multiple predecode groups, as shown next with reference to FIG. 5.

Figure 5:
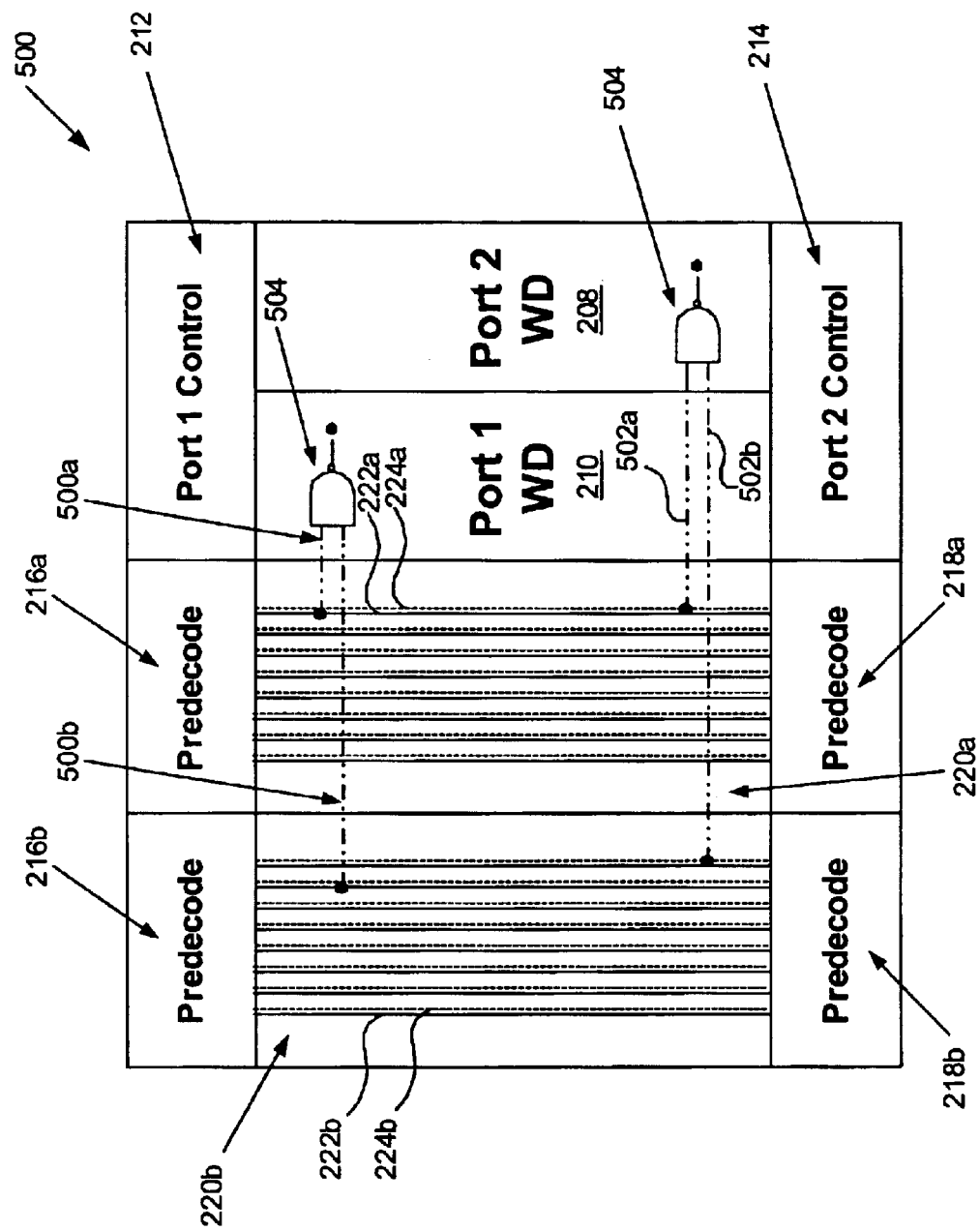
FIG. 5 is a block diagram showing a multiport memory having multiple overlapping row decode groups, in accordance with an embodiment of the present invention.

FIG. 5 is a block diagram showing a multiport memory 500 having multiple overlapping row decode groups, in accordance with an embodiment of the present invention. The multiport memory 500 includes port 1 wordline drivers 210 coupled port 1 control circuitry 212, and port 2 wordline drivers 208 coupled to port 2 control circuitry 214. In addition, two overlapping row decode groups 220a and 220b are used to address the port 1 wordline drivers 210 and the port 2 wordline drivers 208. In particular, overlapping row decode group 220a is coupled to port 1 decode circuitry 216a and port 2 predecode circuitry 218a. Similarly, overlapping row decode group 220b is coupled to port 1 decode circuitry 216b and port 2 predecode circuitry 218b.

As above, each overlapping row decode group 220a and 220b includes a plurality of port 1 predecode wires 222a and 222b and a plurality of port 2 predecode wires 224a and 224b that are utilized to address the port 1 wordline drivers 210 and the port 2 wordline drivers 208. To conserve area, embodiments of the present invention overlap the port 1 and port 2 predecode wires 222a/222b and 224a/224b. That is, the port 1 predecode wires 222a and 222b occupy a different metal layer than the port 2 predecode wires 224a and 224b. In this manner, the port 1 and port 2 predecode wires 222a/222b and 224a/224b can "stack" above one another, which conserves area.

Further, at least one metal layer is disposed between the metal layers in which the port 1 predecode wires 222a/222b and the port 2 predecode wires 224a/224b are formed. As a result, port 1 and port 2 wordline driver connections 500a/500b and 502a/502b can be positioned on a metal layer between the metal layers occupied by the port 1 and port 2 predecode wires 222a/222b and 224a/224b.

The example of FIG. 5 illustrates the use of multiple overlapping row decode groups for addressing the wordline drivers for the data ports, wherein each port includes 64 wordline drivers. Using a single row decode, the number of predecode wires needed to address the wordline drivers is the same as the number of wordline drivers. Thus, if each port includes 64 wordline drivers, 64 predecode wires are needed in a single row decode to address all the wordline drivers. To reduce the number of required predecode wires, and thus required area, multiple overlapping row decode groups can be used.

In the example of FIG. 5, two overlapping row decode groups 220a and 220b are used to address the 64 wordlines drivers for each port. Each overlapping row decode 220a and 220b includes eight predecode wires for each port. That is, overlapping row decode 220a includes eight port 1 predecode wires 222a and eight port 2 predecode wires 224a. Similarly, overlapping row decode 220b includes eight port 1 predecode wires 222b and eight port 2 predecode wires 224b. To provide proper addressing for each address, a wordline driver connection is coupled to a predecode wire in each overlapping row decode 220a and 220b, and the two wordline connections are connected to a NAND gate.

For example, in FIG. 5, to address a particular port 1 wordline driver 210, a port 1 wordline driver connection 500a is coupled to a port 1 predecode wire 222a in the overlapping row decode 220a and a port 1 wordline driver connection 500b is coupled to a port 1 predecode wire 222b in the overlapping row decode 220b. The wordline driver connections 500a and 500b are also connected to a NAND gate 504. Similarly, to address a particular port 2 wordline driver 208, a port 2 wordline driver connection 502a is coupled to a port 2 predecode wire 224a in the overlapping row decode 220a and a port 2 wordline driver connection 502b is coupled to a port 2 predecode wire 224b in the overlapping row decode 220b. The wordline driver connections 502a and 502b are also connected to a NAND gate 504. In this manner, sixteen predecode wires can be used to address 64 wordline drivers for each port.

Generally, the same predecode configuration is used for each port of the multiport memory 500. In this manner, the predecode wires of each port can overlap each other. That is, the first row decode group for port 2 overlaps the first row decode group for port 1, and the second row decode group for port 2 overlaps the second row decode group for port 1. This pattern continues for each row decode group used in the multiport memory. In a further embodiment, the row decode groups can be formed over non-corresponding row decode groups for a different port when the overlapping row decode groups include the same number of predecode wires. For example, the first row decode group for port 2 can overlap the second row decode group for port 1, and the second row decode group for port 2 can overlap the first row decode group for port 1.

In one embodiment, optimum placement and utilization of the techniques of the present invention is implemented utilizing a generator. The generator should be generally understood to include one or more generators, and each generator can be specifically optimized for a particular task. Such tasks or sub-tasks, for example, can include generating an overlapping row decode (e.g., as shown in FIG. 2) to be used with a memory device.

Figure 6A:
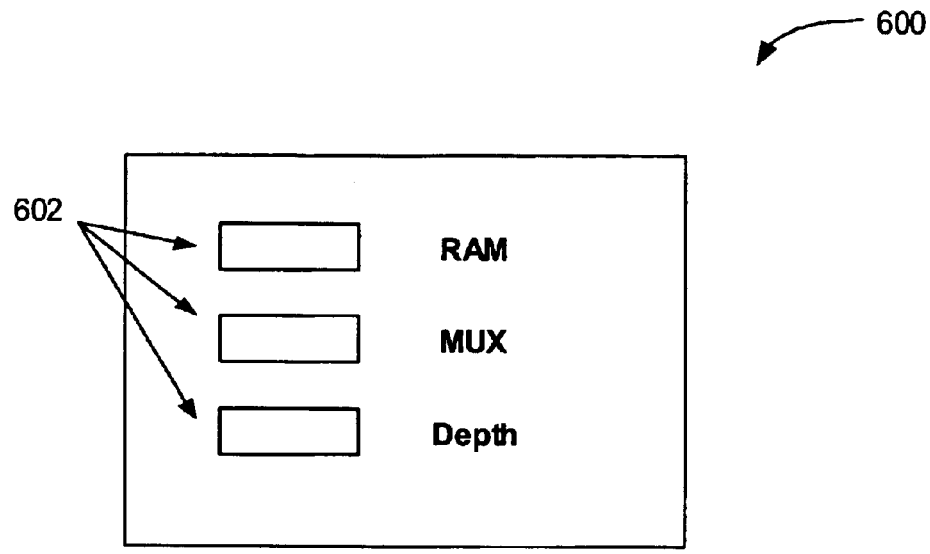
FIG. 6A is a block diagram showing an exemplary simplified memory generator graphical user interface (GUI) front end, in accordance with an embodiment of the present invention.

FIG. 6A is a block diagram showing an exemplary simplified memory generator graphical user interface (GUI) front end 600, in accordance with an embodiment of the present invention. The exemplary memory generator GUI 600 illustrates one view utilized for entering parameters into fields 602 to define a particular memory application. Broadly speaking, the memory generator checks the validity of the entered data and executes appropriate generators to define the memory application. After receiving data utilizing the GUI front end view 600, a memory generator of the embodiments of the present invention processes the data utilizing a memory generator backend, as described next with reference to FIG. 6B.

Figure 6B:
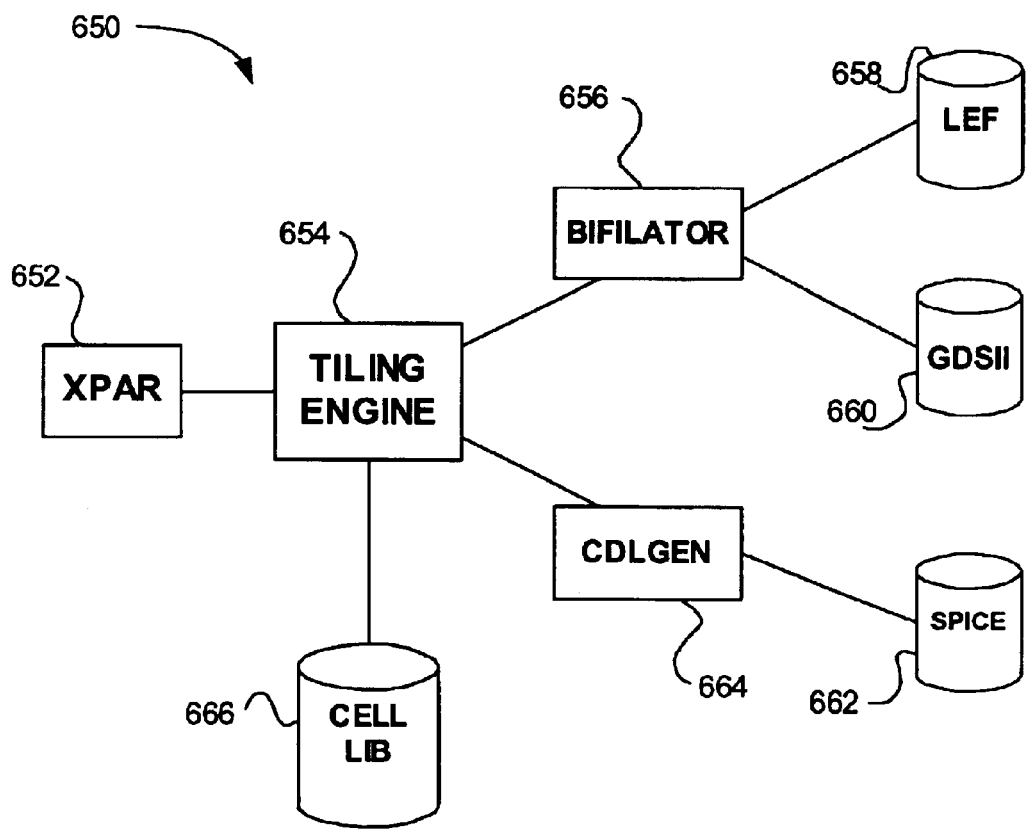
FIG. 6B is a block diagram showing an exemplary memory generator backend, in accordance with an embodiment of the present invention.

FIG. 6B is a block diagram showing an exemplary memory generator backend 650, in accordance with an embodiment of the present invention. The memory generator backend 650 comprises an XPAR process 652, a tiling engine 654, a Bifilator process 656, a CDLGEN process 664, and a cell library 666. Generally speaking, these processes function together to generate a LEF model 658, a GDSII model 660, and a SPICE model 662 for the particular memory application. The LEF model 658 comprises place and route information, which is utilized by routers to manufacture integrated circuits. The GDSII model 660 comprises mask layouts and is utilized by semiconductor foundries. The SPICE model 662 includes circuit interconnection definitions, operational properties, and schematic diagrams of the memory application. Thus, the designer can use the SPICE model of the application for cross verification.

As mentioned above, the exemplary memory generator backend 650 processes the data received via the GUI front end 600. More specifically, the XPAR process 652 encapsulates the rules needed to utilize particular cell layouts stored in the cell library. These rules, along with the parameter data for the memory application are then provided to the tiling engine 654 for optimization and cell placement. By separating the functions of the XPAR process 652 from those of the tiling engine 654, individual rules can be altered for specific applications without altering the functions and placement algorithms utilized in the timing engine 654.

The Bifilator process 656 generates an interface around a particular device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 656 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Furthermore, although embodiments of the present invention have been described in terms of a dual port memory, it should be noted that embodiments of the present invention can be utilized for any number of ports. Accordingly, the present embodiments are to be considered as illustrative and not restrictive, and the invention is not to be limited to the details given herein, but may be modified within the scope and equivalents of the appended claims.

What is claimed is:

1. A method for making a row decode in a multiport memory, comprising the operations of:

forming a first plurality of predecode wires on a first metalization layer, the first plurality of predecode wires configured to address wordline drivers of a first port;

forming a plurality of wordline connections on a second metalization layer above the first metalization layer, a first portion of the plurality of the wordline connections in communication with the wordline drivers of the first port and the first plurality of predecode wires; and forming a second plurality of predecode wires on a third metalization layer above the second metalization layer, the second plurality of predecode wires configured to address wordline drivers of a second port, wherein the second plurality of predecode wires is in communication with a second portion of the plurality of wordline connections that are further in communication with the wordline drivers of the second port.

2. A method as recited in claim 1, wherein the second plurality of predecode wires overlaps the first plurality of predecode wires.

3. A method as recited in claim 2, wherein the first metalization layer is an m1 layer.

4. A method as recited in claim 3, wherein the second metalization layer is an m2 layer.

5. A method as recited in claim 4, wherein the third metalization layer is an m3 layer.

6. A method as recited in claim 1, further comprising the operations of:

forming a fourth plurality of predecode wires on the third metalization layer, the fourth plurality of predecode wires configured to address wordline drivers of the first port; and forming a fifth plurality of predecode wires on the first metalization layer, the fifth plurality of predecode wires configured to address wordline drivers of the second port, wherein the first portion of the plurality of the wordline connections are further in communication with the fourth plurality of predecode wires, and wherein the second portion of the plurality of the wordline connections are further in communication with the fifth plurality of predecode wires.

7. A method as recited in claim 1, further comprising the operation of designing the mutliport memory using a generator.

8. A multiport memory, comprising:

a first plurality of predecode wires positioned on a first metalization layer, the first plurality of predecode wires configured to address wordline drivers of a first port;

a second plurality of predecode wires located on a third metalization layer above the first metalization layer, the second plurality of predecode wires configured to address wordline drivers of a second port; and a plurality of wordline connections formed on a second metalization layer between the first metalization layer and the third metalization layer, a first portion of the plurality of wordline connections in communication with the first plurality of predecode wires and the wordline drivers of the first port, a second portion of the plurality of wordline connections in communication with the second plurality of predecode wires and the wordline drivers of the second port.

9. A mutliport memory as recited in claim 8, wherein the second plurality of predecode wires overlaps the first plurality of predecode wires.

10. A mutliport memory as recited in claim 9, wherein the second plurality of predecode wires are skewed from the first plurality of predecode wires.

11. A multiport memory as recited in claim 8, wherein the first plurality of predecode wires, the second plurality of predecode wires, and the plurality of wordline connections form a first overlapping row decode unit.

12. A multiport memory as recited in claim 11, further comprising a second overlapping row decode unit, wherein the second row decode unit is used in conjunction with the first overlapping row decode unit to address the first port and second port.

13. A multiport memory as recited in claim 8, wherein the first metalization layer is an m1 layer.

14. A multiport memory as recited in claim 13, wherein the second metalization layer is an m2 layer.

15. A multiport memory as recited in claim 14, wherein the third metalization layer is an m3 layer.

16. A mutliport memory as recited in claim 8, wherein the multiport memory is designed using a generator.

17. A generator for generating a row decode in a multiport memory, comprising the operations of:

logic that generates a first plurality of predecode wires on a first metalization layer, the first plurality of predecode wires configured to address wordline drivers of a first port;

logic that generates a plurality of wordline connections on a second metalization layer above the first metalization layer, a first portion of the plurality of the wordline connections in communication with the wordline drivers of the first port and the first plurality of predecode wires; and logic that generates a second plurality of predecode wires on a third metalization layer above the second metalization layer, the second plurality of predecode wires configured to address wordline drivers of a second port, wherein the second plurality of predecode wires is in communication with a second portion of the plurality of wordline connections that are further in communication with the wordline drivers of the second port.

18. A generator as recited in claim 17, wherein the second plurality of predecode wires overlaps the first plurality of predecode wires.

19. A generator as recited in claim 18, wherein the first metalization layer is an m1 layer, the second metalization layer is an m2 layer, and the third metalization layer is an m3 layer.

20. A generator as recited in claim 19, further comprising:

logic that generates a fourth plurality of predecode wires on the third metalization layer, the fourth plurality of predecode wires configured to address wordline drivers of the first port; and logic that generates a fifth plurality of predecode wires on the first metalization layer, the fifth plurality of predecode wires configured to address wordline drivers of the second port;

logic that connects the first portion of the plurality of the wordline connections to the fourth plurality of predecode wires; and logic that connects the second portion of the plurality of the wordline connections to the fifth plurality of predecode wires.

* * * * *